(12) United States Patent
Li et al.

(10) Patent No.: US 7,746,571 B2
(45) Date of Patent: Jun. 29, 2010

(54) LARGE-FIELD UNIT-MAGNIFICATION PROJECTION OPTICAL SYSTEM

(75) Inventors: Tiejun Li, Shanghai (CN); Ling Huang, Shanghai (CN); Jun Wei, Shanghai (CN)

(73) Assignee: Shanghai Micro Electronics Equipment Co., Ltd., Shanghai (CN)

( * ) Notice: Subject to any disclaimer, the term of this patent is extended or adjusted under 35 U.S.C. 154(b) by 0 days.

(21) Appl. No.: 12/302,824

(22) PCT Filed: Dec. 4, 2006

(86) PCT No.: PCT/CN2006/003271

§ 371 (c)(1),
(2), (4) Date: Nov. 28, 2008

(87) PCT Pub. No.: WO2007/140663

PCT Pub. Date: Dec. 13, 2007

(65) Prior Publication Data

US 2009/0185290 A1    Jul. 23, 2009

(51) Int. Cl.
*G02B 9/60*     (2006.01)
*G02B 17/00*    (2006.01)

(52) U.S. Cl. .................... 359/766; 359/727
(58) Field of Classification Search ............ 353/97–99, 353/81–82; 359/726–727, 649, 663, 754, 359/763–764, 766; G02B 17/00, 17/08, 17/04, G02B 17/02
See application file for complete search history.

(56) References Cited

U.S. PATENT DOCUMENTS 5,559,629 A * 9/1996 Sheets et al. .............. 359/727
5,805,356 A    9/1998 Chiba et al.
6,757,052 B2  6/2004 Goo et al.
6,863,403 B2  3/2005 Mercado et al.
6,879,383 B2 * 4/2005 Mercado ................... 355/67

FOREIGN PATENT DOCUMENTS

JP    8-179217    7/1996

* cited by examiner

*Primary Examiner*—Ricky L Mack
*Assistant Examiner*—Zachary Wilkes
(74) *Attorney, Agent, or Firm*—Rabin & Berdo, P.C.

(57) ABSTRACT

The present invention discloses a large-field unit-magnification projection optical system. The optical system includes an optical axis, a spherical concave reflection mirror; a lens group with positive refracting power arranged adjacent the mirror with an air space therebetween. The lens group includes a first plano-convex lens, a negative meniscus lens adjacent the plano-convex lens, a positive lens adjacent the negative meniscus lens, a negative double-convex lens spaced apart far from the positive lens, and a second plano-convex lens. The optical system further includes a pair of prisms each having respective first and second surface. The second surfaces are arranged adjacent the flat surface of the plano-convex lens element on opposite sides of the optical axis and the first surfaces are arranged adjacent object planes and image planes, respectively. Each lens in the lens group and the pair of prisms provide chromatic aberration correction in a spectral region that contains at least g, h and i-line wavelengths. In this projection optical system, the object plane is parallel to the image plane.

4 Claims, 2 Drawing Sheets

FIG. 1 (Prior Act)

LARGE-FIELD UNIT-MAGNIFICATION PROJECTION OPTICAL SYSTEM

TECHNICAL FIELD

The present invention relates to optical projection systems and in particular to a large-field unit-magnification projection optical system.

BACKGROUND OF THE INVENTION

At present, photolithography is widely employed in sub-micron resolution integrated circuit (IC) manufacturing. With an increasing degree in gold-bumping and other wafer-level IC packaging technologies, there has been an increasing demand for the projection optical system having a large depth of focus, a high throughput, and a relatively low (i.e., a few microns) resolution. Projection photolithography has been developed and applied gradually.

The present invention described below is related to the optical system described in U.S. Pat. No. 6,879,383 (hereinafter, "the '383 patent") issued on Apr. 12, 2005 to Mercado and assigned to Ultratech, Inc.

FIG. 1 is a cross-sectional diagram of an example optical system 100 according to the '383 patent.

The invention described in the '383 patent is a large field, broad spectral band, color-corrected, anastigmatic projection optical system that projects an image of a pattern formed on a reticle onto a substrate.

The term "large field" means a field having a rectangular dimension of about 50 mm×100 mm or greater. Also, the term "broad spectral band" refers a spectral band that includes the g, h, i, spectral lines of mercury (i.e., 436 nm, 405 nm, 365 nm).

Optical system 100 includes, along an axis A1, a concave spherical mirror M with an associated aperture stop AS2. The mirror M includes an aperture AP on the optical axis. The aperture AP may be used, for example, to introduce light into the optical system for aligning of an object (e.g., a mask) with its image or inspecting the object. The optical system 100 is essentially symmetrical relative to an aperture stop AS2 so that the system 100 is initially corrected for coma, distortion, and lateral chromatic aberration. All of the spherical surfaces in optical system 100 are nearly concentric.

Optical system 100 further includes a field corrector lens group G with positive refractive power arranged along axis A1 adjacent to and spaced apart from mirror M. The lens group G includes a positive lens element L1 with surfaces S3 and S4. The positive lens L1 is plano-convex with surface S4 being convex and surface S3 being flat. The lens group G further includes adjacent lens element L1 and towards mirror M at least two negative lens L2 and L3. Lens L2 has surfaces S5 and S6 and Lens L3 has surfaces S7 and S8. Negative lenses L2 and L3 are meniscus type, with S6 and S8 being convex.

Adjacent lens group G is a first prism PA with surfaces S1A and S2A, and a second prism PB with surfaces S1B and S2B. The surface S1A faces an object plane OP2 and the surface SIB faces an image plane IP2. The object plane OP2 and the image plane IP2 are spaced apart from respective flat surfaces S1A and S1B by respective gaps WDA and WDB representing working distances. There is complete symmetry with respect to the aperture stop AS2, WDA=WDB. Although prisms PA and PB are not included in field corrector lens group G, these prisms play a role in the aberration correction, including chromatic aberration correction.

However, there is a certain angle between the object plane and the image plane. Because the object plane is not parallel to the image plane, there are some difficulties in photolithography machine design.

SUMMARY OF INVENTION

It is an object of the present invention to provide a large-field, broad-spectral band, color-corrected, anastigmatic projection optical system that an object plane is parallel to an image plane.

In order to achieve the aforementioned object, the present invention is set forth as follows: the optical system includes an optical axis, a spherical concave reflection mirror; a lens group with positive refracting power arranged adjacent the mirror with an air space therebetween. The lens group includes a first plano-convex lens having a convex surface facing the mirror and a flat surface facing away from the mirror, a negative meniscus lens adjacent the plano-convex lens and having a convex surface facing the mirror and a concave surface facing the first plano-convex lens, a positive lens adjacent the negative meniscus lens having a concave surface facing the negative meniscus lens and a convex surface facing the mirror, a negative double-convex lens spaced apart far from the positive lens and having a concave surface facing the positive lens and a concave surface facing the mirror, and a second plano-convex lens having a flat surface facing the negative double-concave lens and a convex surface facing the mirror.

The optical system further includes a pair of prisms each having respective first and second surface. The second surfaces are arranged adjacent the flat surface of the plano-convex lens element on opposite sides of the optical axis and the first surfaces are arranged adjacent object planes and image planes, respectively. Each lens in the lens group and the pair of prisms provide chromatic aberration correction in a spectral region that contains at least g, h and i-line wavelengths.

The optical system has at least one of a square field having a size of at least 44 mm×44 mm, and a numerical aperture of 0.18 or greater.

The lens elements in the lens group are spherical.

The object plane is parallel to the image plane.

The Optical System of the Present Invention

The projection optical system under the large-field and broad-spectral spectrum conditions has good image quality, which requires relatively low resolution and a large depth of focus. In addition, the object plane is parallel to the image plane to reduce risk of photolithography machine design effectively.

DETAILED DESCRIPTION OF PREFERRED EMBODIMENTS

The present invention will be described in detail by reference to the drawings and the preferred embodiments.

Figure 1:
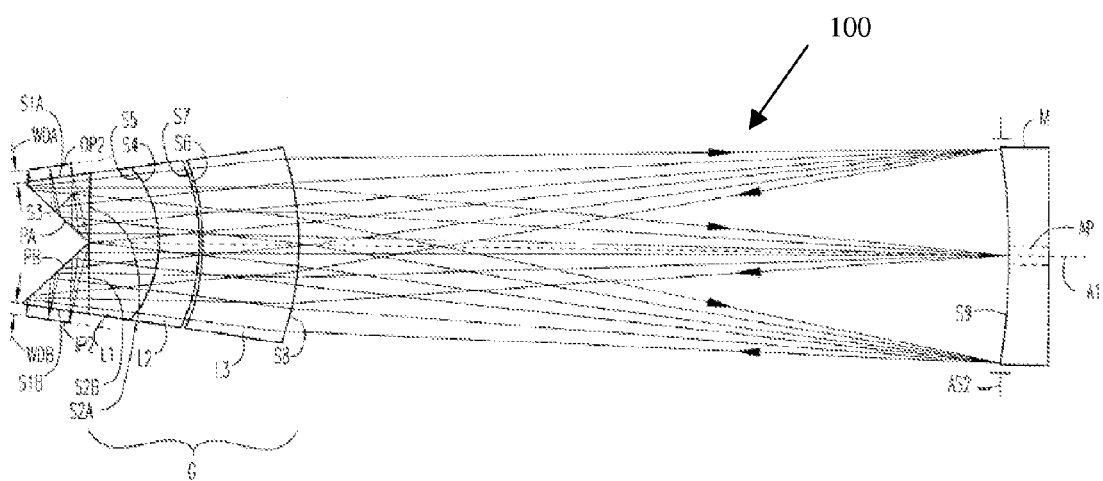
FIG. 1 is a schematic view of an example prior art unit-magnification projection optical system according to the '383 patent.
Figure 2:
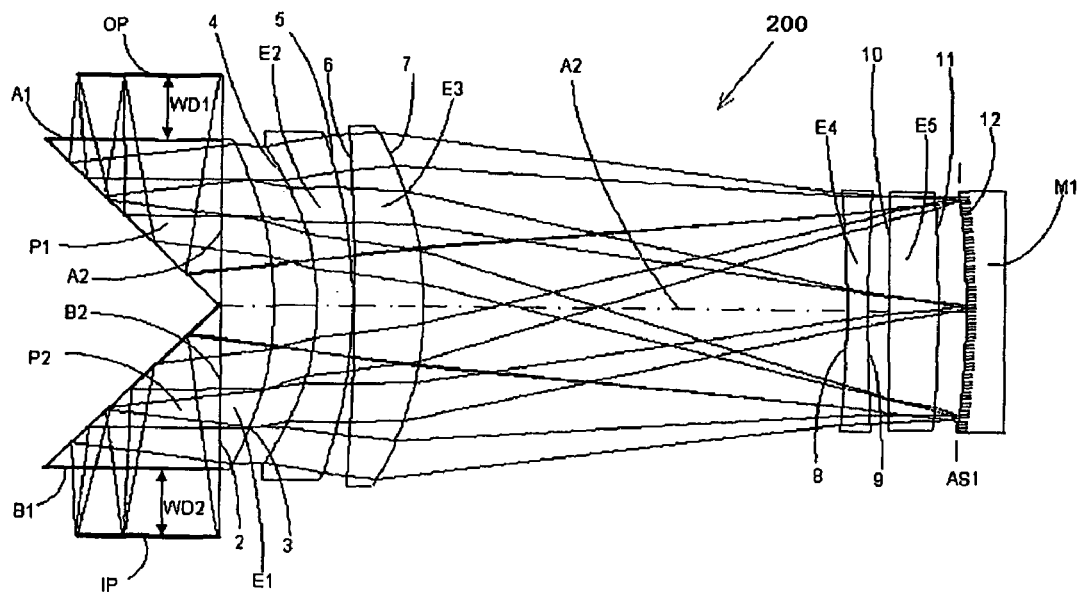
FIG. 2 is a schematic view of an example embodiment of a large-field unit-magnification projection optical system of the present invention.
Figure 3:
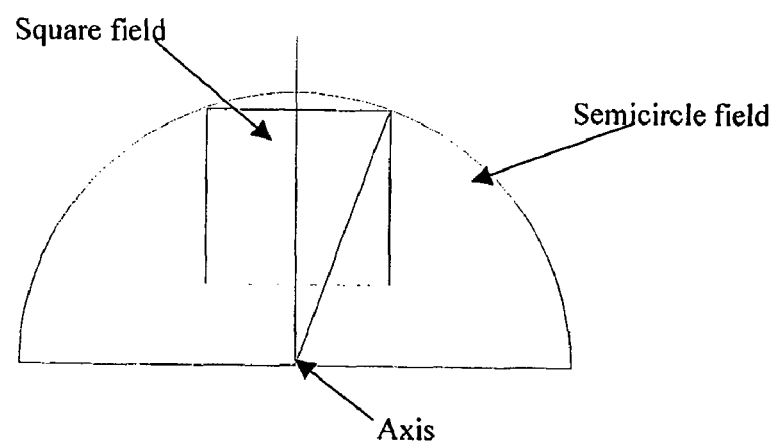
FIG. 3 is a schematic view of a field area of the large-field unit-magnification projection optical system of the present invention.

FIG. 2 is a schematic view of an example embodiment of a large-field unit-magnification projection optical system 200 of the present invention. The optical system 200 includes an axis A2, a concave spherical mirror M1 with an associated aperture stop AS1. The concave spherical mirror M1 has a concave surface 12.

Optical system 200 further includes a lens group with positive refractive power that includes a lens E5 adjacent to and spaced apart from mirror M1, a negative lens E4 adjacent to the lens E5, a positive lens E3 spaced apart from the negative lens E4, and a negative lens E2 adjacent from the positive lens E3.

The lens E5 is plano-convex with a surface 11 being convex and a surface 10 being flat.

The Lens E4 is negative double-concave with a surface 8 and a surface 9 faced to the mirror M1.

The positive lens E3 has a surface 6 being concave and a surface 7 being convex. The convex surface 7 faces the negative double-concave lens E4.

The negative lens E2 is meniscus type, which has a surface 4 being concave and a surface 5 being convex. The convex surface 5 faces the positive lens E3. There is a small air space between the negative lens E2 and positive lens E3.

The plano-convex lens E1 has surface 2 being flat and surface 3 being convex. The convex surface 3 faces to the negative lens E2.

The optical system 200 further includes a first prism P1 with surfaces A1 and A2, and a second prism P2 with surfaces B1 and B2.

The surface A2 of the first prism P1 and the surface B2 of the second prism P2 are closely contact to the surface 2 of the plano-convex lens E1. The surface A1 of the first prism P1 faces an object plane OP and spaces apart from the object plane OP by a gap WD1 representing working distance. The surface B1 of the second prism P2 faces the image plane IP and spaces apart from the image plane IP by a gap WD2 representing working distance.

In example embodiments where there is complete symmetry with respect to the aperture stop AS1, WD1=WD2.

The lens group with positive refractive power, the first prism P1 and the second prism P2 play a role in the aberration correction, including chromatic aberration correction of the g, h, i, spectral lines. The object plane is parallel to the image plane.

The optical system 200 of the present invention has very good image quality. The monochromatic wavefront error (Wavelength=365 nm) is less than 44 nm. Thus, the optical system 200 is useful for wafer-level IC packaging applications, such as bumping lithography and the like, that do not require the highest levels of resolution.

The optical system 200 uses Dyson-Wynne catadioptric structure so that the system 200 is initially corrected for coma, distortion, and lateral chromatic aberration. All of the surfaces in the optical system 200 are spherical surfaces.

Characteristic description of the present invention is described below.

1) Large field. The term "large field" means a field having a rectangular dimension of about 44 mm×44 mm.

2) Broad spectral band. Optical source is g, h i, spectral lines of the mercury (i.e. 436 nm, 405 nm, 365 nm respectively).

3) 1× magnification. The size of the object plane OP is equal to the size of the image plane IP.

4) The object plane is parallel to the image plane IP which is a help to lithography machine design.

5) Dyson-Wynne catadioptric optical system.

Further example embodiments of projection optical system 200 are provided in Tables 1. Because of the symmetry of the optical system 200, the specifications set forth in Tables 1 only include values from the object plane OP to concave mirror M1.

In Table 1, a positive radius indicates that the center of curvature is at the right side of the surface and a negative radius indicates that the center of curvature is at the left side of the surface. The thickness of an element, or the separation between elements, is the axial distance to the next surface, and all dimensions are in millimeters.

Further, "S#" stands for surface number, "STOP" stands for aperture stop AS, and "REFL" stands for reflection surface. Under the heading "Shape", a flat surface is denoted by "FLT", a spherical surface by "SPH", "CC" by concave surface, and "CX" by convex surface. Under the heading "Radius", "INF" denotes that the value of radius is infinity.

TABLE 1

| Numerical Aperture | Field Height 72 mm | | Design Wavelengths 436 nm, 405 nm, 365 nm | |
|---|---|---|---|---|
| 0.18 | | | Element Description | |
| Surface Description | | | Thickness or | |
| S# | Radius | Shape | Separation | Material | TION |

| S# | Radius | Shape | Separation | Material | TION |
|---|---|---|---|---|---|
| 0 | INF | FLT | 40.0000 | | Working distance WD1 |
| 1 | INF | FLT | 100.0000 | Fused Silica | Prism P1/P2 |
| 2 | INF | FLT | 30.0000 | Fused Silica | E1 |
| 3 | −200.0000 | CX SPH | 24.0000 | | |
| 4 | −156.0000 | CC SPH | 20.0000 | Fused Silica | E2 |
| 5 | −303.0000 | CX SPH | 1.0000 | | |
| 6 | −1443.0000 | CC SPH | 40.0000 | Fused Silica | E3 |
| 7 | −204.0000 | CX SPH | 240.0000 | | |
| 8 | −750.0000 | CC SPH | 12.0000 | Fused Silica | E4 |
| 9 | 1123.0000 | CC SPH | 12.0000 | | |
| 10 | INF | FLT | 28.0000 | Fused Silica | E5 |
| 11 | −968.0000 | CX SPH | 16.0000 | | |
| 12 | −526.0000 | CC SPH | | REFL(STOP) | M1 |

In Table 1, The Materials used in the optical system 200 are fused silica and all optical surfaces are spherical. The field height is 72 mm, the numerical aperture is 0.18 and Optical source is g, h i, lines of the mercury lamp (i.e. 436 nm, 405 nm, 365 nm respectively).

What is claimed is:

1. An optical system comprising: an optical axis; a spherical concave reflection mirror; a lens group with positive refracting power arranged adjacent the mirror with an air space therebetween, the lens group comprising in order farthest from, to closest to, the mirror:

a first plano-convex lens element having a convex surface facing the mirror and a flat surface facing away from the mirror;

a negative meniscus lens element adjacent the first plano-convex lens and having a convex surface facing the mirror and a concave surface facing the first piano-convex lens element;

a positive lens element adjacent the negative meniscus lens having a concave surface facing the negative meniscus lens and a convex surface facing the mirror;

a negative double-concave lens element spaced apart far from the positive lens element and having a concave surface facing the positive lens and a concave surface facing the mirror;

a second piano-convex lens element having a flat surface facing the negative double-concave lens element and a convex surface facing the mirror;

a pair of prisms each having respective first and second surfaces, wherein the second surfaces are arranged adjacent the flat surface of the first piano-convex lens element on opposite sides of the optical axis, and wherein the first surfaces are arranged adjacent object planes and image planes, respectively; and wherein each lens element in the lens group and the pair of prisms provide chromatic aberration correction in a spectral region that contains at least g, h and i-line wavelengths.

2. The optical system of claim 1, having at least one of a square field having a size of at least 44 mm×44 mm, and a numerical aperture of 0.18 or greater.

3. The optical system of claim 1, wherein the lens elements in the lens group are spherical.

4. The optical system of claim 1, wherein the object plane is parallel to the image plane.

* * * * *